United States Patent [19]

Kato et al.

[11] 3,830,592

[45] Aug. 20, 1974

[54] SEMICONDUCTOR WAFER POSITIONING DEVICE

[75] Inventors: Nori Kato, Tokyo; Katsumi Momose, Yokohama, both of Japan

[73] Assignee: Canon Kabushiki Kaisha, Tokyo, Japan

[22] Filed: Nov. 6, 1972

[21] Appl. No.: 304,211

[30] Foreign Application Priority Data

Nov. 8, 1971 Japan .............................. 46-103255

[52] U.S. Cl. ......................... 355/73, 355/78, 355/87

[51] Int. Cl. ............................................ G03b 27/60

[58] Field of Search ..................... 355/73, 78, 86, 87

[56] References Cited

UNITED STATES PATENTS

| | | | |
|---|---|---|---|
| 3,521,953 | 7/1970 | Tancredi | 355/87 X |
| 3,645,622 | 2/1972 | Cachon et al. | 355/78 X |
| 3,674,368 | 7/1972 | Johannsmeier | 355/78 |
| 3,705,769 | 12/1972 | Johannsmeier | 355/78 X |

*Primary Examiner*—Samuel S. Matthews
*Assistant Examiner*—Richard A. Wintercorn
*Attorney, Agent, or Firm*—Toren, McGeady and Stanger

[57] ABSTRACT

A printing device for printing a pattern on a semiconductor wafer comprising
- means for holding a photomask carrying the printing pattern,
- a printing light source,
- stage means for supporting the semiconductor wafer, and
- means for adjusting the relative position between said photomask-holding means and said stage means, said means having a self-centering means including reciprocating means which positions the photomask-holding means and stage means relative to each other in a predetermined position.

9 Claims, 10 Drawing Figures

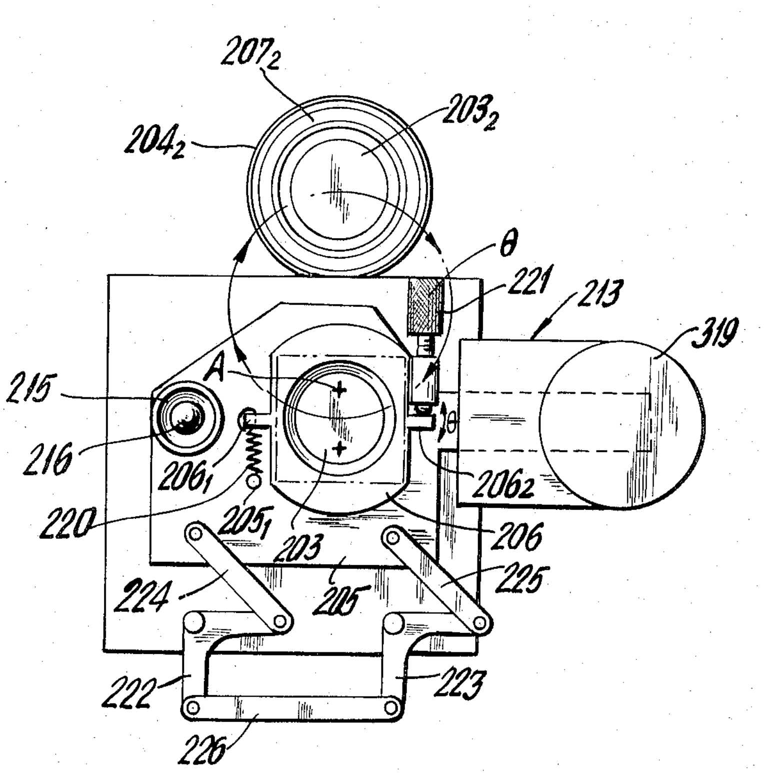
FIG. 8
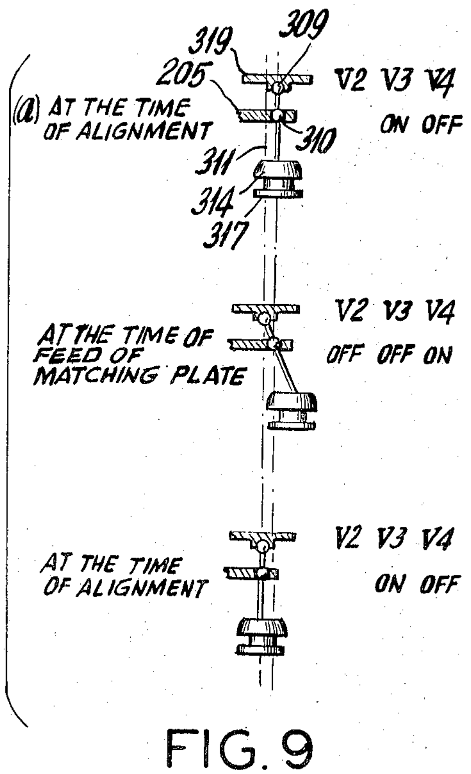
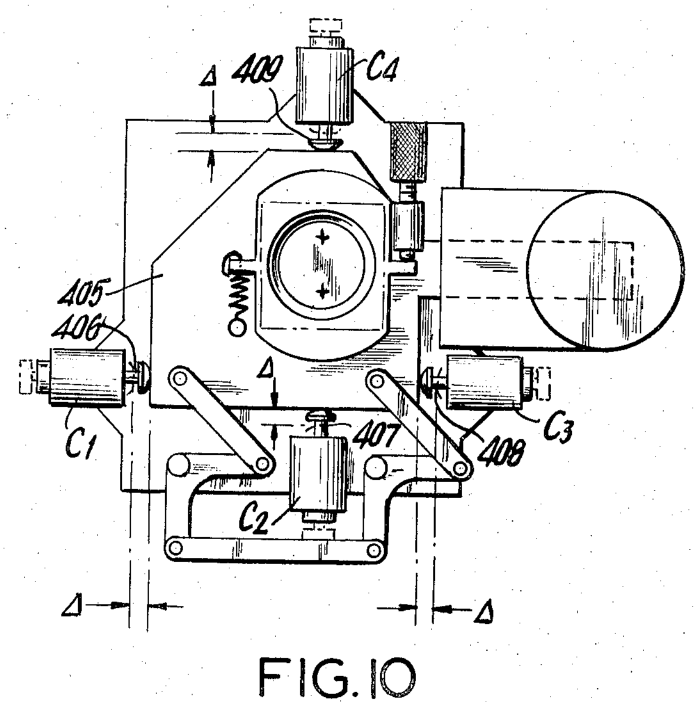
FIG. 9 FIG. 10

SEMICONDUCTOR WAFER POSITIONING DEVICE

This invention relates to a device for positioning semiconductor wafers, and particularly to a positioning device suited for use with a semiconductor wafer printing machine.

Conventionally to produce semiconductor integrated circuit elements, a desired circuit pattern is printed on a photoresist layer applied on a semiconductor wafer substrate, which is then subjected to the development, etching and other treatments. Thereafter the semiconductor wafer is coated again with a photoresist layer on which a second circuit pattern is to be printed, and the semiconductor wafer must be placed at a precise position coinciding with the pattern printed at the first printing. This is accomplished by moving either the wafer support or the pattern to be printed to allow the matching of the position-indicating mark put on the first pattern with the image of the position-indicating mark put on the second pattern to be printed, while viewing them through a microscope. The exposed semiconductor wafer is removed for the purpose of subjecting it to the development, etching and other treatments, and the wafer support is returned to its original position, that is, the position at which the center of the support coincides with the optical axis of the optical system for printing. However, the mask having the pattern to be printed remains stationary at the same position of the preceding printing position, so that when the treated semiconductor wafer is mounted again on the reinstalled support, the wafer is off-set a substantial distance from the preceding position occupied when the preceding printing was carried out. Therefore, a conventional printing machine encounters problems because the supporting member which attaches the perimeter of the wafer to the support to fix the wafer on the support holds down the wafer at a position which deviates considerably deviated from the predetermined position, and a part of the wafer surface which is shielded by the wafer-support member will not be available exposure of the desired pattern which thus cannot be applied as a whole to the wafer. Furthermore, in some cases, a part of the perimeter of the wafer is set up out of the wafer holding member so as not to effect the flatness of the wafer.

Further, in a conventional semiconductor printing machine each time a wafer or photomask having a pattern to be printed is set up, there develops an extreme deviation from the position at which they are located with a high accuracy relative, and a rough coincidence in the predetermined position is effected by chance. Thus the modes occur at random so that the locating operation takes a great deal of time.

The object of the present invention is to obviate such conventional defects. According to this invention, a wafer support means or photomask support means is provided with a self-centering means to allow the setting-up of the both means in a predetermined relative position by self-centering at the time of their alignment prior to the exposure, and thereafter to permit their positioning with a high accuracy.

In the following, examples of the embodiments of the present invention will be explained in connection with the accompanying drawings.

FIG. 8 is a top view of the printing machine shown in FIG. 6.

FIG. 9 is a figure illustrating the change-over of a clutch applicable to the device shown in FIG. 2.

FIG. 10 shows another modification of the self-centering device of the present invention.

Figure 1:
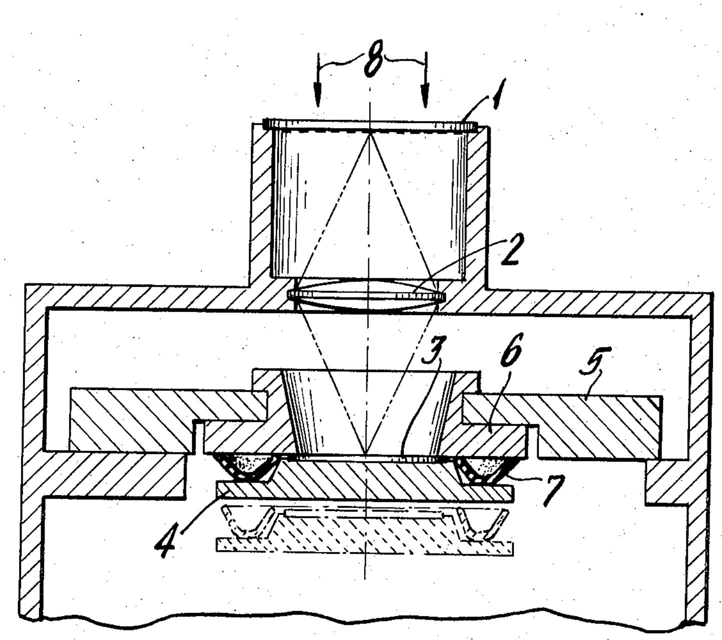
(PRIOR ART) FIG. 1
FIG. 1 shows the principal components of a conventional semiconductor wafer printing device.

FIG. 1 shows the principal components of a conventional semiconductor wafer printing device comprising a photomask 1, a projecting lens 2, a semiconductor wafer 3, a wafer support plate 4, a movable stage 5 which is movable parallel to the two directions of X-axis and Y-axis, and a wafer-receiving ring 6 incorporated rotatably in the stage 5. In the operation of the device, a wafer is mounted on the wafer suport plate 4 reinstalled at the position shown by the chain lines, and the plate 4 is then lifted up to contact the perimeter of the wafer 3 with the under side of the ring 6 where it is held fixed by a suction means 7. A light 8 is projected to the photomask 1, and its pattern is focused on the wafer by the lens 2. After the first printing has been completed, the wafer-support plate 4 is returned to the position shown by the chain lines, and the wafer is removed. After the wafer has been subjected to the development, etching and other treatments, it is mounted again on the support plate 4 in order to carry out the second printing. If the best printing is to be effected, the position of the pattern printed at the first time should be precisely matched with the position of the image of the next pattern. Such matching is made by moving the stage 5 so as to superimpose the image of the position-indicating mark put on the next pattern on the position-indicating mark put on the preceding pattern, while viewing them through a microscope. In sequence, the third and fourth superimposed printings are carried out in a manner similar to the above. However, each time the wafer is removed, the support is returned to its original position, that is, the position at which the center of the support coincides with the optical axis of the lens, while the stage remains in the position to which it has been displaced at the preceding time. Thus, insofar as the situation remains unchanged, it happens that the wafer mounted on the ring 6 will be located at a position involving extreme deviation. The deviation will result in such inconvenience that a part of the wafer will be unexposed due to shielding by the wafer-receiving ring 6, or the range within which the stage 5 can be moved to allow the positioning will be narrowed to a great extent. Also, the positioning operation could be made impossible to effect, or a part of the perimeter of the wafer may be set up out of the ring 6, whereby the flatness of the wafer will not be effected. Therefore, the stage displaced at the preceding time for the purpose of the alignment should be returned to the position at which the center of the ring 6 coincides with the optical axis of the lens 2, before the next wafer is mounted. This procedure is called "centering."

FIGS. 2–6 show an example of a device having the said self-centering mechanism embodying the present invention, which includes a photomask 1, a projecting lens 2, a wafer 3, a wafer support plate 4, a movable stage 5, and a stage ring 6 which are identical to those shown in FIG. 1. The device permits some choice in the selection of the mechanism for aligning the stage 5. A feed screw mechanism such as a micrometer head may be used, but the mechanism shown in the drawing consists of a lever having a handle 9 at one end and two spherical portions 10, 11 adjacent each other at the opposite end. The spherical portion 10 which acts as a supporting point of the lever 12 is movably mounted in the machine support structure 13, while the spherical portion 11 is inserted in the bore 14 of the stage 5, so that when the handle 9 is moved front-to-back and right-to-left, the movement is transferred to the stage 5 to cause movement through a reduced distance in the X-axis and Y-axis directions. The mechanism includes self-centering device which comprises a tapered hole 15 formed in the stage 5, a rod 17 having a spherical (or spherical cone) portion 16 fitting the tapered hole which is loaded in the machine support structure 13 and is movable up and down, and an assembly 18 which is interconnected with the rod 17 to effect a rising and falling motion of the rod 17. The elevating assembly 18 may be of the foot-treadle type, or of the manually operated lever type, but an air cylinder or an electromagnetic device may also be utilized. An air cylinder is preferable because the apparatus includes an air suction assembly, the power of which may be applied thereto.

Figure 2:
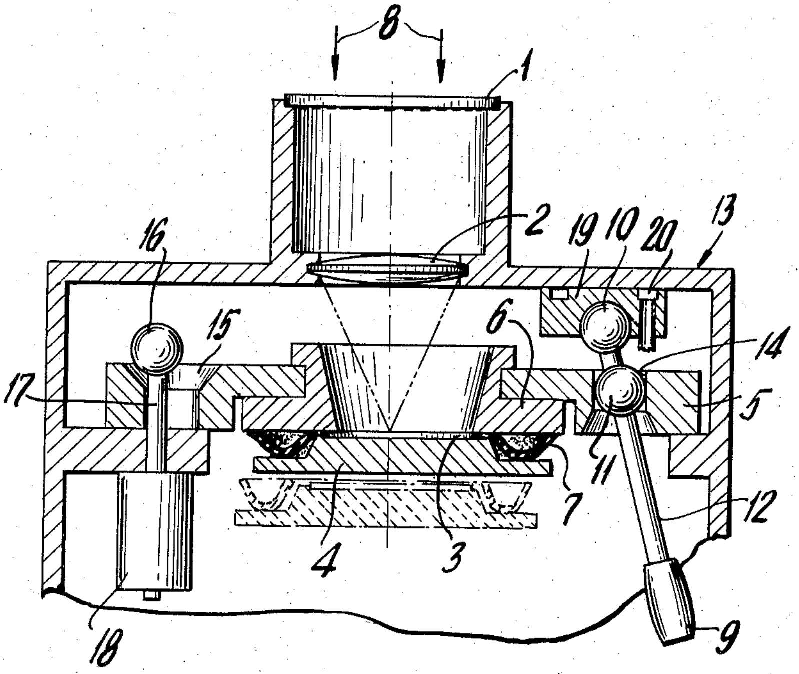
FIG. 2 shows the principal components of a printing device of the present invention.
Figure 3:
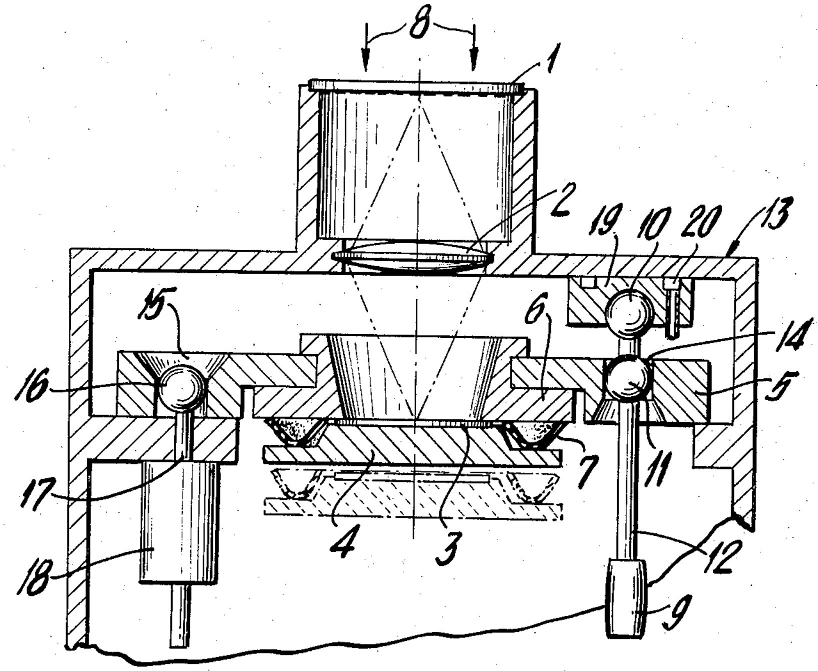
FIGS. 3 and 4 are figures illustrating states in the alignment procedure of the device shown in FIG. 2.

In the above-mentioned device, when the alignment of the stage 5 is required, the stage is made movable within the range of the tapered hole 15 by lifting up the rod 17 and its spherical portion 16 as shown in FIG. 2. In this state, the alignment of the stage can be freely carried out by operating the mechanism for aligning the stage 5. After the printing of the wafer 3 has finished, the elevating assembly 18 of the rod 17 is actuated to allow the insertion of the spherical portion 16 into the tapered hole as shown in FIG. 3, whereby the centering returns the stage 5 to the position at which the center of the ring 6 coincides with the optical axis of the lens 2. The wafer support plate 4 is reinstalled at the position shown by the chain lines in order to replace the wafer with the next wafer to be printed. The new wafer is then attached to the stage ring 6 reinstalled by the centering. During the time that this centering is carried out, the stage operating assembly consisting of the lever 12 and the spherical portions 10, 11 is liable to hinder the movement of the centering. In order to remove such hindrance, there may be advantageously employed a slide guide 19 mounted on the machine support structure 13, whereby the spherical portion 10 as a supporting point is not mounted directly on the machine support structure 13 but to the slide guide 19, and a clutch mechanism which can fix the slide guide 19 on the machine support structure 13 by applying vacuum to an air suction means 20 incorporated between the slide guide 19 and the machine support structure 13. When the slide guide 19 is made movable by releasing the application of vacuum, the centering is carried out without hindrance. As for the stage ring 6, it is provided for the purpose of controlling the angular displacement of the wafer 3, and it is equipped with an additional rotary adjusting means. The self-centering device of the present invention is similarly applicable to this stage ring.

Figure 4:
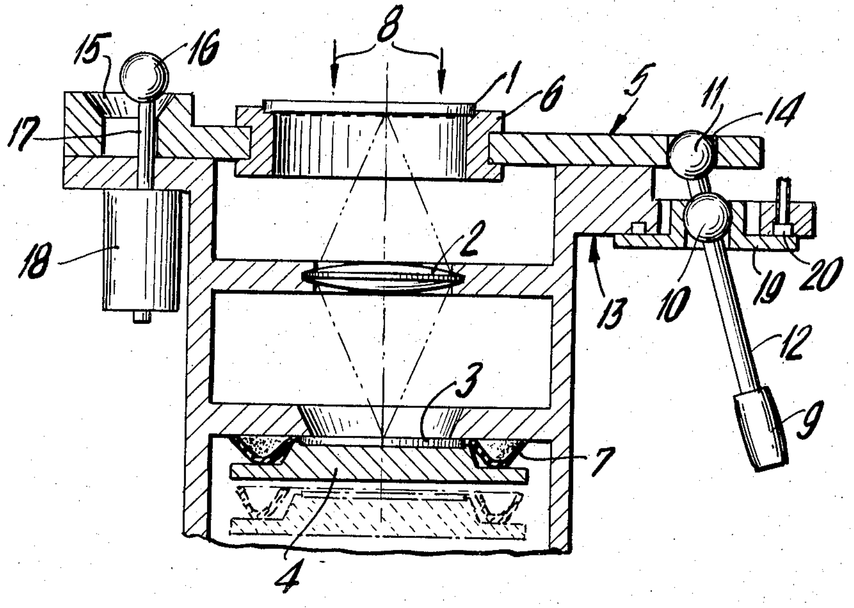

The foregoing explanation is applied to an apparatus wherein the photomask and wafer are positioned relative to each other by moving the wafer relative to the stationary photomask. However, the invention is also applicable to apparatus wherein the photomask is movable relative to the stationary wafer. FIG. 4 shows an example of such an application, wherein the positioning is made accomplished by moving the movable stage 5 carrying a photomask 1 mounted on its stage ring 6. The stage-adjusting device and the self-centering device are identical to those shown in FIGS. 2 and 3. Further, there is involved a wafer-printing apparatus of the contact type utilizing the contact printing method instead of the projecting method, in which the photomask is directly superimposed on the wafer. In aid of the positioning in this case, the device of the present invention is also applied so as to return the stage carrying either the photomask or the wafer to a normal position.

As has been mentioned above, the invention enables convenient the operation of the semiconductor wafer printing apparatus by the provision of a device comprising a tapered hole 15 formed in the movable stage which is to be positioned together with either a wafer contacted therewith or a photomask placed thereon, a rod 17 having a spherical (or spherical cone) portion 16 fitting the tapered hole 15 which is movably loaded in the machine support structure 13, and an assembly 18 which elevates the rod 17 in an interlocking relationship, whereby the insertion of the spherical portion 16 into the tapered hole 15 readily returns the stage to the normal position.

Figure 5:
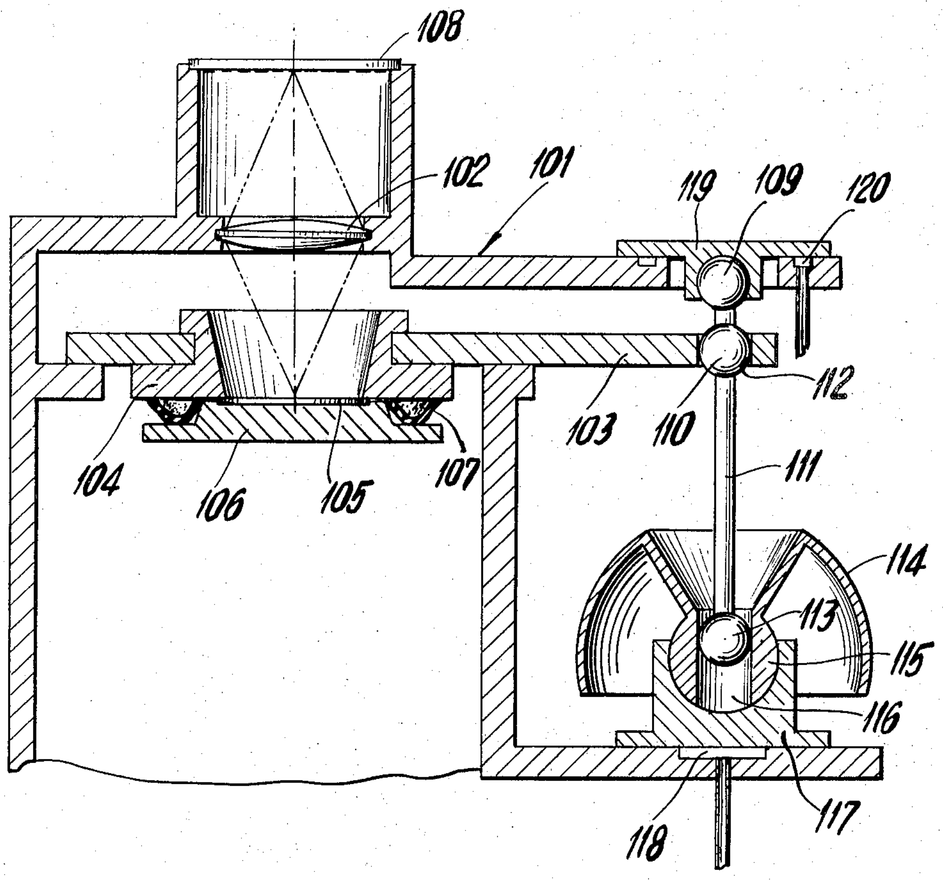
FIG. 5 is a modification of the assembly for alignment shown in FIG. 2.

FIG. 5 shows a modification of the stage-operating mechanism such as the lever 12 shown in FIG. 2, by which both of the rough adjustment and fine adjustment are made possible at the time of alignment. In FIG. 5, there are shown a machine support structure 101, a projecting lens 102, a movable stage 103 mounted in a machine support structure 101 which is movable parallel to the two directions of X-axis and Y-axis, a stage ring 104 mounted rotatably in the stage 103, a wafer 105, a wafer support plate 106, a suction adhering means 107 loaded on the support plate 106 which when adhered by suction to the stage ring 104 attaches the wafer 105 to the under side of the ring 104, and a photomask 108 having a pattern to be printed, whereby the wafer is positioned relative to the photomask by moving the stage 103. The spherical portion 109 of a lever 111 having two spherical portions 109, 110 adjacent each other at one end is directly or indirectly loaded as a supporting point of the lever 111 on the machine support structure 101, and the other spherical portion 110 is inserted in a bore 112 formed in the stage 103. The other end of the lever 111 includes an additional spherical portion 113 which is inserted in a long bore 116 of a sphere 115 having a hemispherical handle 114, and the sphere 115 is pivoted in a slide guide 117 mounted movably on another part of the machine support structure 101 in such a manner that the centers of the sphere 115 and spherical portion 113 are off-set. A device 118 providing a clutch mechanism such as an air suction means is mounted between the slide guide 117 and the machine support structure 101. The slide guide 117 can be fixed on the machine support structure 101 by the actuation of the device 118, and it is free to move relative to the machine support structure 101 when the device 118 is inoperative.

In the above-mentioned apparatus, when the handle is moved to incline the long bore 116 of the sphere 115 pivoted in the fixed movable slide guide 117, the spherical portion 113 is moved due to the deviation of the center of the spherical portion 113 from that of the sphere 115, so that the lever 111 is moved around the spherical portion 109 of the opposite end of the lever 111. The movement of the lever 111 is transferred to the stage 103 through the spherical portion 110, thus the fine adjustment of the movable stage can be accomplished made. On the other hand, when the clutch means is released to make free the movable slide guide 117, the front-to-back and right-to-left motion of the handle 114 moves widely the lever 111 together with the slide guide 117, and thus the rough adjustment of the stage 103 can be accomplished made.

The indirect mounting of the spherical portion 109 as a supporting point of the lever 110 on the machine support structure 101 can be effected by providing a movable plate 119 mounted movably in a sliding manner on the machine support structure 101, and by loading the spherical portion 109 to it. By a clutch assembly 120 such as an air suction means which is loaded between the movable plate and the machine support structure, the movable plate 119 is fixed on the machine support structure 101 when the clutch is actuated, while when the clutch is made inoperative the movable plate 119 is made movable relative to the machine support structure 101. The lever 111 is usually operated under such conditions that the movable plate 119 is fixed on the machine support structure 101 as if the spherical portion 109 is directly loaded on the machine support structure 101. In case the device for reinstalling the stage to the normal position is incorporated in the stage 103 besides said adjusting device including the lever 111, however, the incorporation of the movable plate 119 provides an advantage in that a hindrance to the reinstallment which will be caused by the presence of the adjusting device can be avoided to allow a light smooth reinstallment of the stage.

According to the mechanism of the present invention, when the movable slide guide is made stationary, the smooth fine adjustment of the movable stage can be carried out by inclining the handle, while when the movable slide guide is made movable, the rough adjustment of the stage can be carried out by moving the handle horizontally. Moreover, the change-over between the fine and rough movements can be easily made. Thus the invention enables convenient the operation of the entire apparatus.

Figure 6:
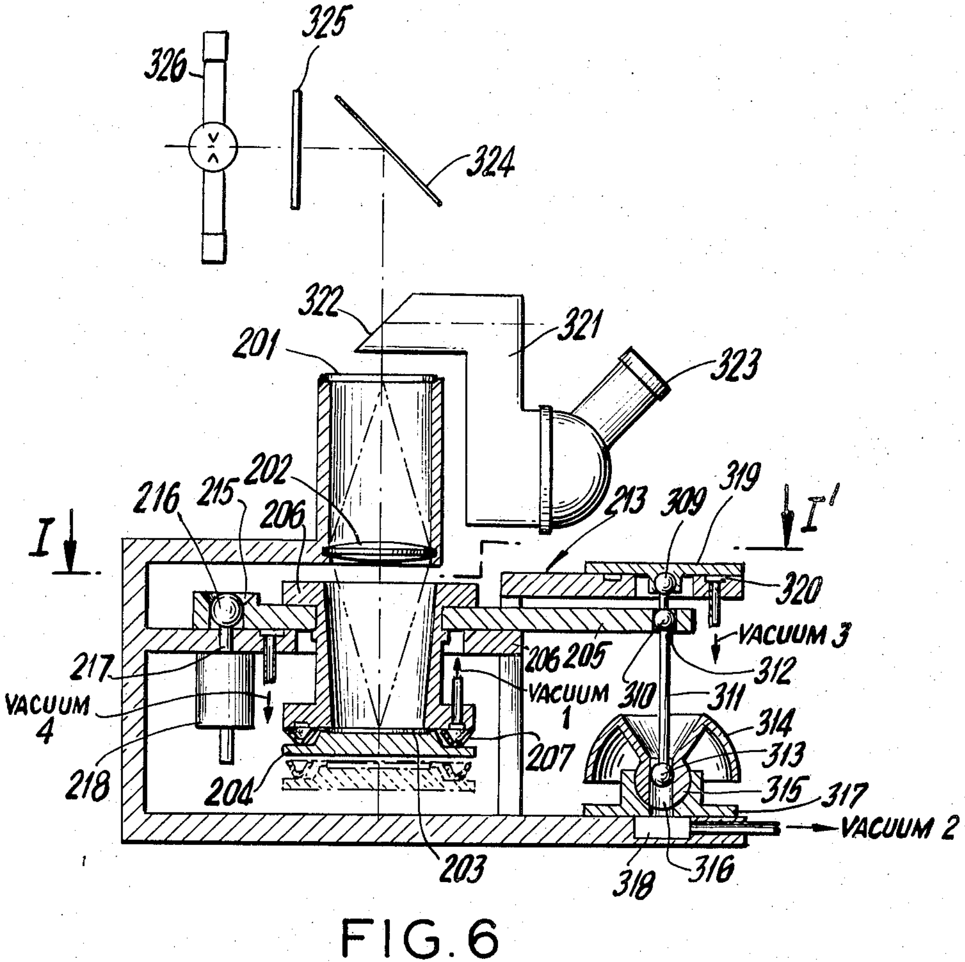
FIG. 6 shows a printing machine including the devices shown in FIGS. 2 and 5.
Figure 7:
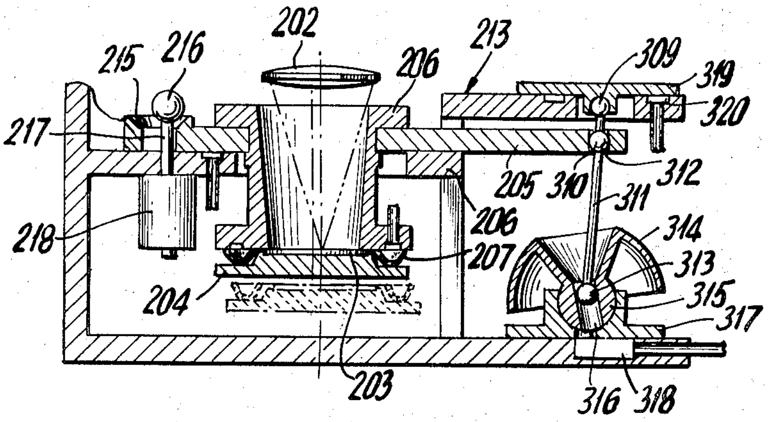
FIG. 7 is a figure illustrating a state of the printing machine shown in FIG. 6.

FIG. 6 is a sectional view of an entire semiconductor wafer-printing machine including the centering device shown in FIG. 2 and the adjusting device shown in FIG. 5, wherein members 201 – 218 correspond to those denoted by 1 – 18 in FIG. 2 and members 309 – 320 correspond to those denoted by 109 – 120 shown in FIG. 5. An alignment scope 321 including an eye piece 323 is provided for viewing the position-matching marks on the wafer and mask, and a half mirror 322 is inclined and disposed in the optical path of a mask 201. Further, there are shown a half-mirror 324 for printing, an ultraviolet transmitting filter 325 and an ultraviolet light source 326. FIG. 8 shows a sectional view taken on the line I–I′ of FIG. 6, wherein a tension spring 220 is hung between the partially projecting portion $206_1$ of the stage ring 206 mounted on the stage 205 and a pin attached on the stage 205. The tip of a finely adjustable dial 221 is contacted with a projecting portion $206_2$ of the stage ring 206 to allow the rotation of said ring in the direction of $\theta$. Members 222 – 226 compose a pantograph for limiting the amount of rotation amount in the $\theta$-direction. Members $203_2$ represents a second semiconductor wafer mounted on the wafer support plate $204_2$ which is mounted together with a wafer support plate $204_2$ on a turn table (not shown). In the abovementioned arrangement, the alignment is carried out, after a sensitive photoresist has been applied on the semiconductor wafer 203 and the elevating assembly 218 has been actuated. The position matching mark put on the mask and mark A put on the wafer are positioned relative to each other by operating the handle 314 while viewing them through the alignment scope 321, and vacuum is applied to the clutch assembly in such manner that as shown in FIG. 9 $V_2$ is "on" or "off" when the rough or fine adjustment is made respectively, $V_3$ is "on" and $V_4$ is "off". In this case, the stage 205 is displaced as a whole, but further the displacement of the stage ring 206 in the $\theta$-direction is made by rotating the dial 221, and thus the alignment is carried out by the displacement in the directions of X, Y and $\theta$. When the mark put on the mask is perfectly matched with the mark put on the wafer, the light source 326 is lighted and the printing is carried out.

Next $V_1$ is then turned to "off" to free a wafer support plate (not shown) free, and a turn table (not shown) is rotated until the next wafer support plate $204_2$ is set up underneath the stage ring 206. The elevating assembly is actuated to allow the centering of the stage 205, and then the alignment is carried out in a manner similar to the above. As mentioned above, the stage has been reinstalled by the centering prior to the alignment, so that the alignment can be carried out very smoothly. The wafer is positioned almost accurately at the center of the stage ring, so that when vacuum is applied to the valve $V_1$, the perimeter of the wafer is held in good flatness by the uniform attachment to the stage ring.

In the modification shown in FIG. 10, the stage 403 carries four cylinders $C_1$, $C_2$, $C_3$ and $C_4$ at the sides thereof as the self-centering means. In the self-centering, air is supplied to every cylinder to reinstall the stage at a predetermined position. Next the alignment is carried out, after the supply of air to the cylinders is stopped and the head 406, 407, 408, 409 of each cylinder is drawn back to the position shown by the two-dots chain lines through a distance A. The other components are identical to those shown in FIG. 8. Therefore, a detailed explanation thereof will be omitted.

While specific embodiments of the invention have been shown and described in detail to illustrate the application of the inventive principles, it will be understood that the invention may be embodied otherwise without departing from such principles.

What is claimed is:

1. A printing device for printing a pattern on a semiconductor wafer comprising means for holding a photomask carrying said printing pattern, a light source for printing, stage means for supporting said semiconductor wafer, means for adjusting the relative position between said photomask holding means and said stage means, said adjusting means having a self-centering means including reciprocating means for positioning said photomask holding means and said stage means relative to each other in a predetermined position, with said self-centering means including a spherical member interlocking with said reciprocating means and with said stage means including a thru-hole having a tapered portion which is interlocked with said spherical member to allow movement of said stage means to said predetermined position.

2. A printing device for printing a pattern on a semiconductor wafer comprising a light source for printing, means for holding a photomask carrying the printing pattern placed at a position to be irradiated by luminous flux from said light source, stage means for supporting said semiconductor wafer, said stage means having a wafer support plate which contacts the surface of the wafer with positioning of the wafer being performed at the time of printing using said support plate as a reference plane, an imaging lens system positioned between said holding means and said stage means to apply the image of the printing pattern on the photomask to the wafer supported on said wafer-supporting plate, alignment means including engagement means engaged with either the stage means or the photomask holding means and first drive means for shifting said stage means and said holding means relative to each other to effect alignment thereof, and self-centering means including second drive means in engagement with either said holding means or said stage means activated prior to said alignment by said first drive means to shift the relative positions of said holding means and of said stage means for automatically adjusting either one of said holding means or said stage means so that the optical axis of said lens system coincides with the center of said wafer-supporting plate, whereby alignment operation by said first drive means is accomplished after center alignment by said second drive means has been automatically effected.

3. A printing device for printing a pattern on a semiconductor wafer comprising means for holding a photomask having a pattern to be printed thereon, stage means for holding a semiconductor wafer, alignment means for adjusting the relative positions between said stage means and said holding means, said alignment means including handle means, a lever member having one end engaged with said handle means in a freely pivoted manner, and having said stage means engaged with a central part thereof, movable means for holding one end of said lever member and adaptable to being switched between two modes of operation comprising either a movable state or a fixed stage, and clutch means engaged with said stage means for selectively converting said stage means between said fixed state and said movable state.

4. A device according to claim 3 wherein said handle means includes a movable member pivotally supporting said handle means, and wherein said member is slidably mounted on a base stand.

5. A device according to claim 4 wherein said handle means include clutch means to fix said movable member on said base stand, said handle means being provided between said movable member and said base stand.

6. A device as claimed in claim 1, characterized in that said adjusting means has further an operation means for positioning said means including a control member, a lever-type coupling member interlocking with said member, and a support means for supporting the other end of said coupling member, and the middle part of said coupling member being interlocked with said stage means.

7. A device as claimed in claim 6, characterized further in that said support means is provided with a clutch means, said means being clutch-released when the self-centering means is operative.

8. A device as claimed in claim 7, characterized in that said control member has a thru-hole interlocking with one end of the coupling member, and a spherical support portion which is to be pivoted, thereby the center of said support portion and the interlocked part of said coupling member are off-set.

9. A device as claimed in claim 8, characterized in that said positioning means is provided with a third clutch means, said means holding said spherical support portion and being de-clutched at least when the self-centering is carried out.

* * * * *

UNITED STATES PATENT OFFICE
CERTIFICATE OF CORRECTION

Patent No. 3,830,592 Dated August 20, 1974

Inventor(s) Nori Kato and Katsumi Momose

It is certified that error appears in the above-identified patent and that said Letters Patent are hereby corrected as shown below:

In the Heading of the Patent:

Add to the recitation of the Foreign Application Priority Data:

--November 13, 1971 Japan........46-105553--.

Signed and sealed this 19th day of November 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334.